United States Patent [19]

Klotz

[11] Patent Number: 4,617,562
[45] Date of Patent: Oct. 14, 1986

[54] MULTICOLORED LIQUID CRYSTAL DISPLAY

[76] Inventor: Dell E. Klotz, 10323 Kirkhill Dr., Houston, Tex. 77089

[21] Appl. No.: 483,729

[22] Filed: Apr. 11, 1983

[51] Int. Cl.$^4$ ................................................ G09G 3/20
[52] U.S. Cl. ................................. 340/753; 340/784; 340/701; 324/96; 350/337; 350/338
[58] Field of Search ............... 340/753, 784, 701, 715, 340/722, 702, 703, 704; 350/337, 338; 455/159; 324/96; 84/464; 73/658

[56] References Cited

U.S. PATENT DOCUMENTS

| | | |
|---|---|---|
| 3,153,739 | 10/1964 | De Graffenried . |
| 3,480,912 | 11/1969 | Speeth et al. . |
| 3,873,979 | 3/1975 | Craford et al. . |
| 3,899,786 | 8/1975 | Greubel et al. ...................... 340/784 |
| 3,913,084 | 10/1975 | Bollinger et al. . |
| 4,008,613 | 2/1977 | Myers ..................................... 73/290 |
| 4,025,164 | 5/1977 | Doriguzzi et al. .................. 350/337 |
| 4,040,719 | 8/1977 | Schiebelhuth ...................... 340/784 |
| 4,249,801 | 2/1981 | Masubuchi ......................... 350/338 |
| 4,286,265 | 8/1981 | Kauffman et al. .................. 340/753 |
| 4,295,136 | 10/1981 | Stoutenburg ........................ 340/784 |
| 4,319,081 | 3/1982 | Martin et al. . |
| 4,328,490 | 5/1982 | Usuba et al. ........................ 340/715 |
| 4,399,513 | 8/1983 | Sullivan et al. ..................... 340/753 |
| 4,410,887 | 10/1983 | Stolov et al. ........................ 340/784 |
| 4,416,514 | 11/1983 | Plummer ............................. 350/337 |

FOREIGN PATENT DOCUMENTS 0041199 4/1978 Japan ..................................... 340/704

OTHER PUBLICATIONS

Brochure from Metrix Instrument Co. re Vibration Meter, no date.
Brochure from International Scientific Instruments, Inc., "A Cableless Digital Vibrometer", no date.
Brochure of IRD Mechanalysis, "Model 810 Vibration-Spike Energy Detector," 1979.
Brochure of LYMCO Electronics Company, Inc., re LYMCO PM$^2$, no date.
"Corvette" book dated Feb., 1983.

*Primary Examiner*—Gerald L. Brigance
*Assistant Examiner*—Jeffery A. Brier
*Attorney, Agent, or Firm*—Arnold, White & Durkee

[57] ABSTRACT

There is disclosed a multicolored liquid crystal display for use in intensity level measuring devices of the general type in which the intensity level is converted into a corresponding voltage such as vibration meters. The liquid crystal display has a plurality of shutters. Each shutter defines a display window that is a selected color, and each shutter is activatable by a unique voltage input level. Colors for the display windows are selected which have a universal meaning so that the readout may be easily understood.

27 Claims, 7 Drawing Figures

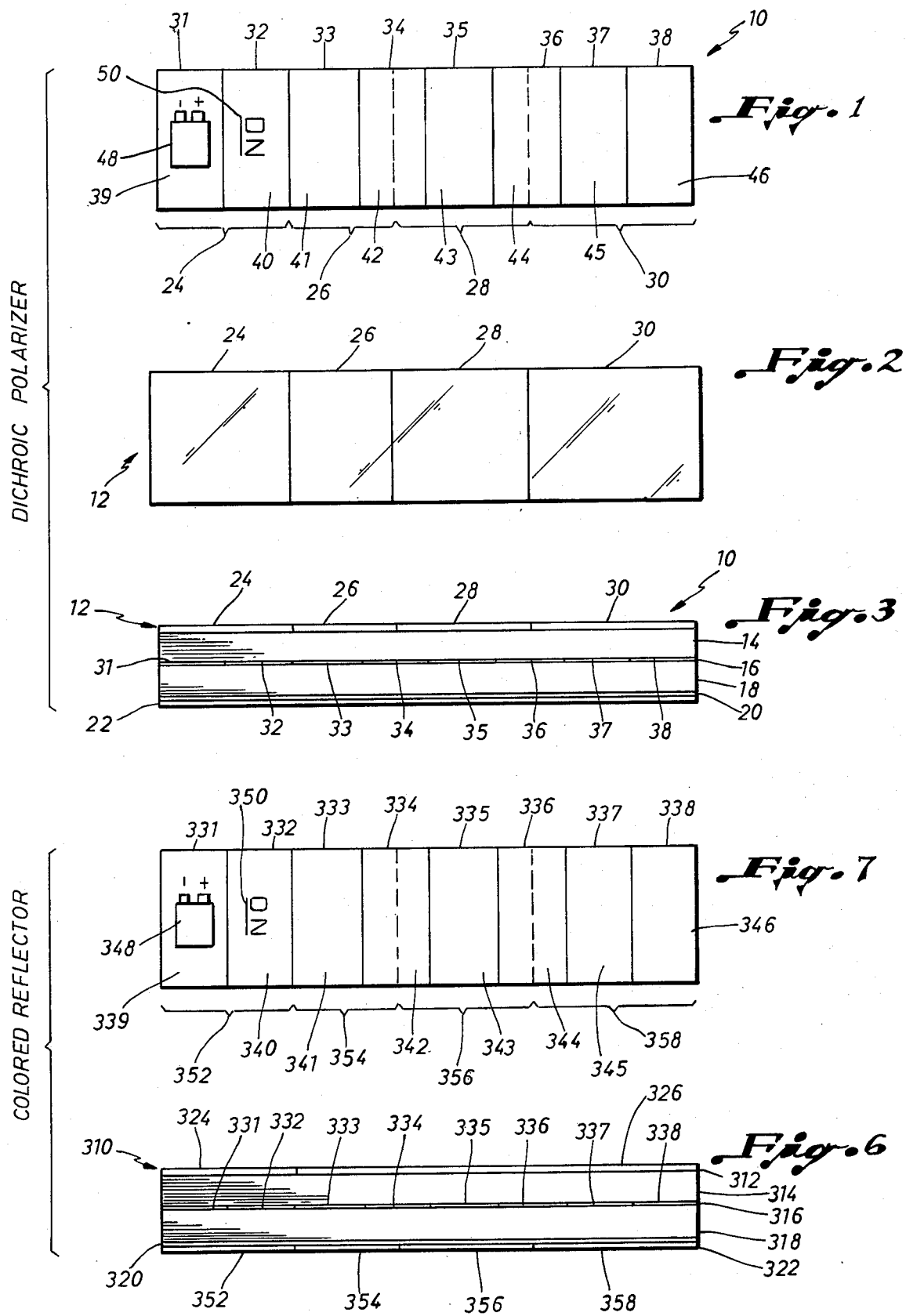

MULTICOLORED LIQUID CRYSTAL DISPLAY

BACKGROUND OF THE INVENTION

1. Field of the Invention

This invention relates generally to multicolored liquid crystal displays. More particularly, this invention concerns a multicolored liquid crystal display for use in devices that measure intensity level and convert the intensity level measurement to a corresponding voltage level.

2. Description of the Prior Art

Moving parts in machinery, equipment and appliances, both industrial and commercial, eventually wear out over prolonged operation, causing breakdown of the whole. In industry, equipment breakdown is economically undesirable because any downtime of the machinery required for repairs is costly. Even worse, failure may be so complete that replacement of the whole piece of equipment is required.

In a commercial setting, such as a business establishment, equipment breakdown can mean lost business. Even in the private home, where appliances such as air conditioners, furnaces and clothing washers are depended upon for convenience and comfort, equipment breakdown is a nuisance and an inconvenience.

In industry, because of the expenses involved in equipment breakdown, vibration analysts are used to periodically check equipment in order to detect future equipment failures at an early stage of deterioration when repairs can be made relatively inexpensively and before conditions for violent, potentially dangerous failure exist. Current vibration analysis practices, however, are both expensive and cumbersome.

The major drawback in present-day vibration analysis practices is that the devices currently on the market for taking vibration measurements are both expensive and difficult to operate. Current vibration meters are highly technical devices that yield complex numerical data that must be interpreted by highly trained personnel. Qualified vibration analysis are hard to find. There are no formal courses offered by academic institutions to train vibration specialists. Rather, they receive their training only through years of field experience. As a result, only about 20% of all industrial plants in the United States presently employ vibration analysts. The remaining 80% are without this analytical tool necessary for the avoidance of expensive equipment failures.

Outside of industry, appliances and equipment such as refrigerators, washers, dryers, air conditioners, furnaces and motor vehicles are all susceptible to component part failure that can be detected early by vibration or noise level analysis. Clearly, in the non-industrial setting, it is prohibitively expensive for home owners and business proprietors to pay a trained analyst to periodically check their equipment and appliances. Further, the available meters for testing are too complex for use by anyone other than a trained vibration specialist. Thus, home owners and business proprietors are currently deprived of services which can detect equipment failure at an early stage.

The problem of complex monitoring device readouts extends beyond the vibration analysis field to any situation in which it is desirable to monitor the intensity level of changing physical properties, such as temperature, velocity, sound, etc., through a readout device when the only individual available to observe the monitor readout is untrained or otherwise incapable of interpreting complex numerical information. It is desirable, therefore, to provide a monitoring device readout that is universally understandable.

SUMMARY OF THE INVENTION

By means of the present invention, there is provided a multicolored display for use in intensity level measuring devices which can be easily and universally understood by non-technical persons.

In one embodiment of the present invention, there is provided a display for an intensity level measuring device of the general type in which the intensity level is converted into a corresponding voltage level. The display comprises a multicolored liquid crystal display which comprises a plurality of shutters, each shutter defining a display window. Each display window is of a selected color when the shutter defining the window is in an activated state, and each shutter is activatable by a unique voltage level whereby the display indicates an intensity level according to the colored display window corresponding to the activated shutter.

In another embodiment of the present invention, the liquid crystal display further comprises a measuring device condition indicating portion having at least one shutter. The shutter defines a display window which is of a selected color when the shutter defining the window is in an unactivated state. The shutter is activatable by a signal produced by a desired measuring device condition.

In a further embodiment of the present invention, the front polarizer of the liquid crystal display comprises a dichroic polarizer that permits only the selected color for each window to be reflected out of the liquid crystal display. The front polarizer has a polarizing axis parallel to a polarizing axis of the rear polarizer.

In still another embodiment of the invention, the reflector comprises a colored reflector behind each shutter, and each colored reflector comprises the color selected for the display window defined by the shutter. The front polarizer has a polarizing axis at 90° to a polarizing axis of the rear polarizer so that each display window is darkened when the corresponding shutter is in an unactivated state and each display window becomes undarkened when the corresponding shutter is in an activated state to permit the colored light reflected off of the colored reflector to pass out of the liquid crystal display.

In a still further embodiment of the invention, the liquid crystal display comprises an elongated member having the plurality of shutters arranged side by side over its length.

In yet another embodiment of the present invention, the intensity indicating display windows are split into discrete first and second halves along the length of the display, the first half indicating a first type of physical condition intensity and the second half indicating a second type of physical condition intensity.

In yet a further embodiment of the present invention, there is provided a vibration meter display for indicating the operating vibration velocity of a machine. The display format comprises a multicolored liquid crystal display which comprises a plurality of shutters, each shutter defining a display window. Each display window is of a selected color when the shutter defining the window is in an activated state, and each shutter is activatable by a unique voltage level, which is generated by a corresponding vibration velocity so that the display format indicates a vibration velocity according to the colored display window corresponding to the activated shutter.

In still another embodiment of the invention, there is provided a vibration meter of the general type which converts a vibration input level into a corresponding voltage level. The vibration meter has a display comprising a plurality of shutters, each shutter defining a display window. Each display window is of a selected color when the shutter defining the window is in an activated state, and each shutter is activatable by a unique voltage level. The unique voltage level is generated by a corresponding vibration level whereby the display indicates a vibration level according to the colored display window corresponding to the activated shutter.

It is therefore an advantage of the present invention that the display is readily visible in bright light because it is a liquid crystal display which is not luminescent.

It is another advantage of the present invention that the shuttered liquid crystal display shows multiple levels of intensity with one display window and is therefore inexpensive to fabricate.

A further advantage of the present invention is that the liquid crystal display can be modified to provide separate readouts for different types of physical condition intensity.

Still another advantage of the present invention is that the liquid crystal display uses less power than other types of displays, especially luminescent displays.

A further advantage of the present invention is that the liquid crystal display has a separate section polarized at 90° to the intensity level readout portion of the display to clearly show the state of the measuring instrument.

BRIEF DESCRIPTION OF THE DRAWINGS

FIG. 1 is a plan view of a preferred embodiment of the multicolored liquid crystal display of the present invention.

FIG. 2 is a plan view of the dichroic front polarizer of the preferred embodiment of the multicolored liquid crystal display shown in FIG. 1.

FIG. 3 is an elevation view along the length of the preferred embodiment of the liquid crystal display shown in FIG. 1.

FIG. 6 is an elevation view of an alternative embodiment of the liquid crystal display of the present invention in which colored reflectors are utilized behind the shutters.

FIG. 7 is a plan view of the liquid crystal display of FIG. 6.

DETAILED DESCRIPTION OF THE PREFERRED EMBODIMENTS

Figure 4:
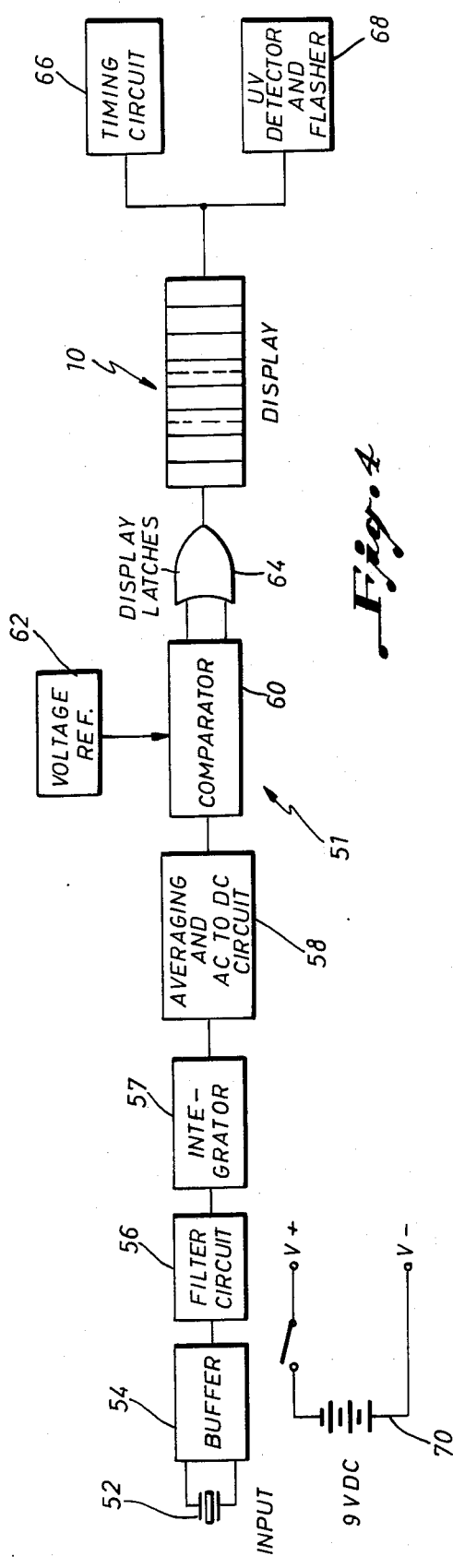
FIG. 4 is a schematic diagram of the liquid crystal display inserted into a vibration meter circuit.

Throughout the following description, similar reference numerals refer to similar elements in all figures of the drawings.

A preferred embodiment of the display of the present invention can best be understood by reference to FIGS. 1, 2 and 3. The reflective shutter type twist nematic liquid crystal display utilizing a dichroic front polarizer is indicated generally at 10. Liquid crystal display 10 comprises a dichroic front polarizer 12, a front glass 14, a twist nematic liquid crystal 16, a rear glass 18, a rear polarizer 20, and a reflector 22.

As shown in FIG. 2, dichroic front polarizer 12 has along its length a first portion 24 that permits only blue light to be reflected back out of liquid crystal display 10. Front polarizer 12 also has a second portion 26 which permits only green light to be reflected back out of the display; a third portion 28 which permits only yellow light to be reflected back out of the liquid crystal display; and a fourth portion 30 which permits only red light to be reflected back out of the display.

Liquid crystal 16 is divided along its length into eight discrete shutters. A shutter 31 and a shutter 32 are positioned behind blue first portion 24 of front polarizer 12. A shutter 33 is positioned behind green second portion 26. A shutter 34 is positioned half behind green second portion 26 and half behind yellow third portion 28. A shutter 35 is positioned behind yellow third portion 28. A shutter 36 is positioned half behind yellow third portion 28 and half behind red fourth portion 30. A shutter 37 and a shutter 38 are positioned behind red fourth portion 30. As best seen in FIG. 1, to one viewing display 10, the display appears to be divided up into discrete windows 39, 40, 41, 42, 43, 44, 45 and 46 being defined by shutters 31, 32, 33, 34, 35, 36, 37 and 38, respectively.

First portion 24 of front polarizer 12 has a polarizing axis oriented at 90° relative to the polarizing axis of rear polarizer 20 while portions 26, 28 and 30 all have a polarizing axis parallel to the polarizing axis of rear polarizer 20. The purpose of these orientations is to provide a clear differentiation between display windows 39 and 40, which indicate measuring device condition and are associated with first portion 24 of polarizer 12, and windows 41, 42, 43, 44, 45 and 46, which indicate the intensity level measured and are associated with portions 26, 28 and 30. The polarizing axis orientations specified will cause measuring device condition indication windows 39, 40 to be colored when shutters 31, 32 are unactivated and intensity level indication windows 41, 42, 43, 44, 45 and 46 to be clear when shutters 33, 34, 35, 36, 37 and 38 are unactivated. The same result may be achieved by dividing rear polarizer 20 into two sections having polarizing axes at 90° relative to each other.

As shown in FIG. 1, blue first portion 24 preferably has a battery symbol 48 silk screened thereon immediately in front of shutter 31 and an "on" symbol 50 silk screened immediately in front of shutter 32. Silk screened symbols 48, 50 are of a color and shade which blend in with blue first portion 24 so that they are not readily visible when windows 39, 40 are colored.

Reflective shutter type twist nematic liquid crystal display 10 as shown in FIGS. 1, 2 and 3 operates as follows. Because the polarizing axis of first portion 24 of front polarizer 12 is oriented at 90° relative to the polarizing axis of rear polarizer 20, windows 39, 40 defined by shutters 31 and 32 corresponding to blue first portion 24 are blue when the intensity level measuring device with which display 10 is associated in not in use, i.e., shutters 31 and 32 are unactivated. By comparison, windows 41, 42, 43, 44, 45 and 46 defined by shutters 33, 34, 35, 36, 37 and 38 are clear. This is because exterior light striking liquid crystal display 10 passes through first portion 24 of front polarizer 12, through front glass 14, shutters 31 and 32 of liquid crystal 16, rear glass 18, and rear polarizer 20. The light then strikes reflector 22 and is reflected back out of liquid crystal display 10. In the unactivated condition, the polarizing axis of rear polarizer 20 is oriented relative to the polarizing axis of blue first portion 24 of front polarizer 12 so that all light is blocked from passing back out of liquid crystal display 10 except blue light.

By contrast, green second portion 26, yellow third portion 28, and red fourth portion 30 of polarizer 12 have a polarizing axis parallel to that of rear polarizer 20. When shutters 33, 34, 35, 36, 37 and 38 are unactivated, all light passes through and is reflected out of liquid crystal display 10. Thus, to one looking at liquid crystal display 10 when the intensity level measuring device into which it is incorporated is not in use, windows 39, 40 corresponding to blue first portion 24 of front polarizer 12 appear blue while the remainder of the display appears clear. Battery symbol 48 and "on" symbol 50 are blue so that they are not readily visible when windows 39, 40 are blue.

When the associated measuring device is turned on, shutter 32 is activated. After light has been reflected off of rear reflector 22 and has passed through rear polarizer 20, activated shutter 32 twists the polarizing axis 90° from the rear face to the front face of liquid crystal 16, thus paralleling the polarizing axis of first portion 24 of front polarizer 12. With the polarizing axis parallel, all of the reflected light freely passes out of the display. To one looking at liquid crystal display 10, display window 40 now appears clear and the "on" symbol 50 becomes visible, clearly indicating that the measuring device is in an "on" condition.

Likewise, when the associated severity measuring device is turned on, shutter 31 can be activated by a signal from the battery so that the polarizing axis is rotated 90° from the rear face to the front face of liquid crystal 16. Again, to one viewing liquid crystal display 10, display window 39 appears clear and battery symbol 48 is visible to indicate the condition of the battery.

The remainder of display 10 operates in the same fashion except that the opposite result is achieved. As previously stated, all light passes out of portions 26, 28 and 30 when shutters 33, 34, 35, 36, 37 and 38 are unactivated because the polarizing axis of portions 26, 28 and 30 and rear polarizer 20 are parallel. When shutters 33, 34, 35, 36, 37 and 38 are activated, they twist the polarizing axis 90°. Portion 26 then permits only green light to pass out of display 10, portion 28 yellow light, and portion 30 red light.

To one viewing display 10, window 41 appears green when shutter 33 is activated; window 42 appears half green and half yellow when shutter 34 is activated; window 43 appears yellow when shutter 35 is activated; window 44 appears half yellow and half red when shutter 36 is activated; and windows 45 and 46 appear red when shutters 37 and 38, respectively, are activated.

FIG. 4 shows liquid crystal display 10 as incorporated into a vibration meter circuit 51. The vibration meter circuit 51 has an accelerometer input 52 for receiving vibration accelerations from a machine and converting those accelerations into a voltage. A buffer 54 matches the high output impedance of the accelerometer input 52 to the lower impedance of an integrater 57 input. Filter circuit 56 filters the frequencies coming into the circuit in order to limit the frequencies to a desired range. For nearly all rotating and oscillating equipment, a frequency range of 10 Hz to 1500 Hz is appropriate.

Integrater 57 can perform a single integration to yield vibration velocity or a double integration to yield vibration displacement. Alternatively, integrater 57 may be eliminated so that the vibration meter circuit yields vibration acceleration. Single integration for most applications is preferable because velocity measurements provide a measure of the combined effects of vibration displacement as well as frequency and can be universally applied regardless of machine speed or type of machine trouble.

Following integration and filtering, the signal passes through an averaging and AC to DC circuit 58. Circuit 58 averages the signal to yield a constant reading level because the reading produced by a machine is too erratic. Circuit 58 also converts the signal from AC to DC because the remainder of the components in the circuit require a DC voltage.

A comparator 60 then compares the incoming voltage to voltage reference 62. A voltage reference is provided for each shutter 33, 34, 35, 36, 37 and 38.

Display latches or shutter drivers 64, one for each shutter 33, 34, 35, 36, 37 and 38, act as exclusive "OR" gates. The vibration meter circuit also includes a timing circuit 66 and preferably a U.V. detector and flasher 68 which causes shutter 31 to flash on and off when the battery voltage decays to a preset level. The entire circuit is powered by a nine volt DC battery 70.

By providing unique voltage reference levels for the vibration indication shutters 33, 34, 35, 36, 37 and 38, each shutter is activated at a certain minimum voltage level and any voltage above that level. Thus, a safe operating vibration velocity range can be indicated with green shutter 33 by establishing a safe voltage reference and a voltage reference which indicates a transition from a safe to a cautious operation vibration velocity condition. When the voltage input equals or exceeds the safe voltage reference, shutter 33 will be activated and twist the polarizing axis 90° so that all but green light is blocked from being reflected back out of display window 41. Only green shutter 33 will be activated as long as the voltage reference established for the transition from a safe to a cautious operating condition is not equaled or exceeded.

When the voltage reference established for a transition from a safe to a cautious operating condition is equaled or exceeded by the inputted voltage, shutter 34 will be activated. Again, a voltage reference for the upper range of this transitional operating condition can be established. When the voltage reference established for the transition from a safe to a cautious operating condition is equaled or exceeded, shutter 34 is activated. Because shutter 34 is positioned half behind green second portion 26 of front polarizer 12 and half behind yellow third portion 28 of front polarizer 12, window 42 appears half green and half yellow when shutter 34 is in its activated condition to indicate the transition from a safe to a cautious operating condition. As long as the voltage reference level established for the upper range of this transitional operating condition is not exceeded, only shutters 33 and 34 will be activated and, therefore, only windows 41 and 42 will appear colored. When the voltage reference at the upper limit of the transitional range is exceeded, the next shutter, shutter 35, is activated and corresponding window 43 will appear yellow.

The foregoing description applies to all the remaining shutters 36, 37 and 38. For each there is established a voltage reference range. When the voltage reference at the upper limit of the range is exceeded, the next shutter is activated. Preferably, voltage references are established so that yellow window 43 associated with shutter 35 indicates a cautious operating condition, half yellow - half red window 44 associated with shutter 36 indicates a transition from a cautious to a dangerous operating condition, red window 45 associated with shutter 37 indicates a dangerous operating condition, and red window 46 associated with shutter 38 indicates a critical upper limit to the dangerous operating condition.

Of course, the voltage reference levels may be set at any level desired by the user. For industrial applications of vibration meters, it is preferable to set the vibration velocity levels according to the Industrial Standard Velocity Severity Chart to comply with Occupational Safety and Health Administration standards. Thus, shutter 33 will be activated when the vibration level exceeds 0.1 inches per second velocity; shutter 34 when the vibration level exceeds 0.2 inches per second; shutter 35 at 0.3 inches per second; shutter 36 at 0.4 inches per second; shutter 37 at 0.5 inches per second; and shutter 38 at an upper critical limit of 1.0 inches per second.

Figure 5:
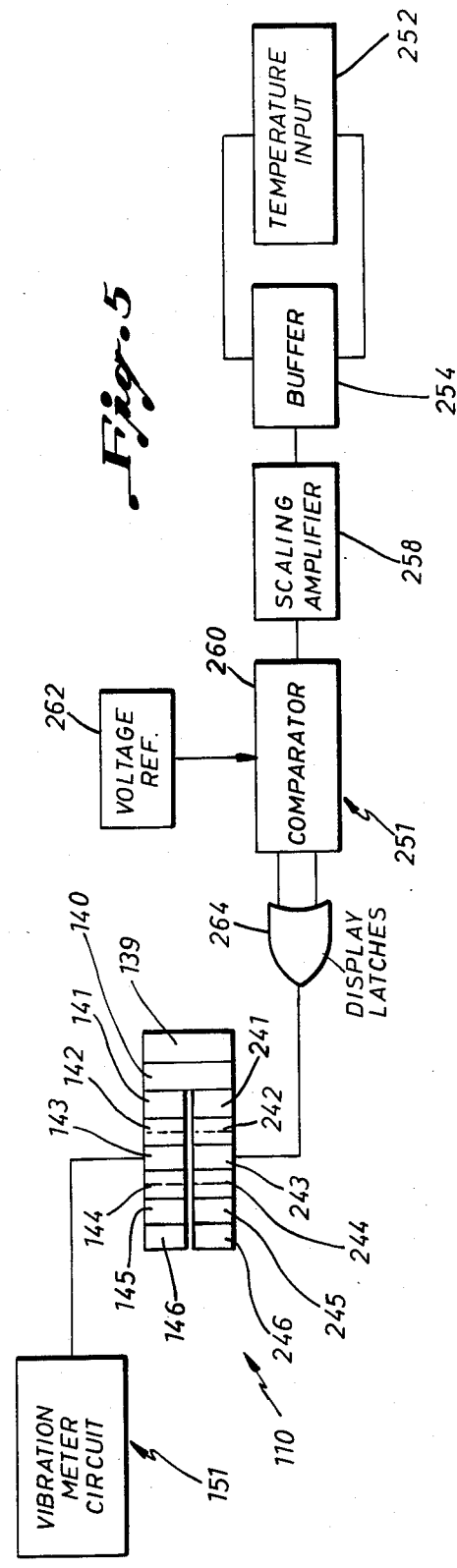
FIG. 5 is a schematic diagram of an alternative embodiment of the display of the present invention in which the liquid crystal display is split longitudinally to provide a vibration velocity and temperature readout.

A modification of the display of the present invention is shown in FIG. 5. Alternative liquid crystal display 110 has display windows 139 and 140 for indicating the battery condition and "on" condition, respectively, of the measuring device into which display 110 is incorporated. Unlike display 10, the remaining display windows of display 110 are split into discrete halves to provide an intensity level display for two separate types of physical properties. As shown in FIG. 5, one half of the display is connected into a vibration meter circuit 151 like the circuit 51 shown in FIG. 4. Again, this half of display 110 is provided with a green window 141, a half green - half yellow window 142, a yellow window 143, a half yellow - half red window 144, a first red window 145, and a second red window 146.

The other half of display 110 is connected into a temperature circuit 251. Temperature circuit 251 has a temperature input 252 which may be, for example, a resistance temperature detector or an infrared input. Temperature input 252 converts temperature to a corresponding voltage. A buffer 254 provides an interface between input 252 and a scaling amplifier 258, which calibrates the circuit according to the type of input 252 used. Temperature circuit 251 also has a comparator 260, voltage reference 262, and display latches 264 which perform the same functions as their counterparts in the vibration meter circuit 51.

Green window 241 indicates a safe operating temperature; half green - half yellow window 242 indicates a transition from a safe to a cautious operating temperature; yellow window 243 indicates a cautious operating temperature; half yellow - half red window 244 indicates a transition from a cautious to a dangerous operating temperature; red window 245 indicates a dangerous operating temperature; and red window 246 indicates a critical upper limit operating temperature.

Referring to FIGS. 6 and 7, there is shown an alternative embodiment of the shutter type liquid crystal display of the present invention. Shutter type liquid crystal display 310 generally includes a front polarizer 312, a front glass 314, a twist nematic liquid crystal 316, a rear glass 318, a rear polarizer 320, and a multicolored reflector 322.

Front polarizer 312 has a first portion 324 having a polarizing axis oriented parallel to the polarizing axis of rear polarizer 320 and a second portion having a polarizing axis oriented at 90° to the polarizing axis of rear polarizer 320 in order to provide a contrast between windows 339 and 340, which indicate measuring device condition, and windows 341, 342, 343, 344, 345 and 346, which indicate intensity level. Unlike front polarizer 12 of liquid crystal display 10, front polarizer 312 is not a dichroic polarizer which permits a specified light to pass out of liquid crystal display 310. Rather, front polarizer 312 blocks all light from passing out of liquid crystal display 310, and color is achieved by using a multicolored reflector 322.

Reflector 322 preferably has a first silver reflecting portion 352, a second green reflecting portion 354, a third yellow reflecting portion 356, and a fourth red reflecting portion 358. When the measuring device into which liquid crystal display 310 is incorporated is not in use, shutters 331 and 332 corresponding to silver reflecting portion 352 are unactivated so that light passing into liquid crystal display 310 will strike silver reflector 352 and be reflected back out of the display. Battery symbol 348 and "on" symbol 350 are silver so that they blend with silver reflector 352 and are not readily visible when the associated measuring device is not in use.

In contrast, when the measuring device is not in use, shutters 333, 334, 335, 336, 337 and 338 are also unactivated. However, because the polarizing axis of second portion 326 of front polarizer 312 is oriented at 90° relative to the polarizing axis of rear polarizer 320, no light will be reflected back out of liquid crystal display 310. Thus, windows 341, 342, 343, 344, 345 and 346 appear dark and without color.

When the measuring device is turned on, shutters 331 and 332 twist the polarizing axis 90° so that windows 339 and 340 now appear darkened. Battery symbol 348 and "on" symbol 350 now are readily visible.

Each shutter 333, 334, 335, 336, 337 and 338 is activated by a predetermined voltage reference level. When the voltage input equals or exceeds the voltage reference level selected for the particular shutter, the shutter twists the polarizing axis 90°, permitting light passing through liquid crystal display 310 to strike the colored reflector portions 354, 356 and 358 and then freely be reflected back out of the display. When the corresponding shutter is activated, windows 341, 342, 343, 344, 345, and 346 appear colored.

The alternative liquid crystal display 310 may readily be incorporated into either of the circuit configurations shown in FIGS. 4 and 5.

It may be appreciated that display colors may be selected to logically correspond with the particular physical property being measured. For example, if the physical property being measured is temperature rather than vibration, it may be desirable to use blue at the low end of the temperature scale and progressively move through violet, red, orange, and yellow colors to indicate an increasing temperature.

The foregoing description has been directed to particular embodiments of the invention in accordance with the requirements of the patent statutes for the purposes of illustration and explanation. It will be apparent, however, to those skilled in this art that many modifications and changes in the apparatus and processes set forth will be possible without departing from the scope and spirit of the invention. It is intended that the following claims be interpreted to embrace all such modifications and changes.

What is claimed is:

1. A display for an intensity level measuring device of the general type in which the intensity level is converted by an electronic circuit into a corresponding voltage level, the display comprising a multicolored liquid crystal display, the liquid crystal display comprising a plurality of shutters, each shutter defining a display window, at least some of the display windows when activated being of a different preselected color or colors from some other activated windows, each shutter being activatable by electronic circuitry responsive to a unique minimum voltage level generated by the electronic circuit, the preselected color or colors of each window remaining unchanged at a voltage level above its minimum unique voltage level whereby the display indicates an intensity level according to the colored display window corresponding to the activated shutter.

2. A display for an intensity level measuring device of the general type in which the intensity level is converted by an electronic circuit into a corresponding voltage level, the display comprising a shutter type twist nematic liquid crystal display, the liquid crystal display comprising in sequence from a front aide to a rear side a front polarizer, a front glass layer, a twist nematic liquid crystal having a plurality of shutters, each shutter defining a display window, a rear glass layer, a rear polarizer, and a reflector, at least some of the display windows, when activated being of a different preselected color or colors from some other activated window, each shutter being activatable by electronic circuitry responsive to a unique minimum voltage level generated by the electronic circuit, the preselected color or colors of each window remaining unchanged at a voltage level above its minimum unique voltage level whereby the display indicates an intensity level according to the colored display window corresponding to the activated shutter.

3. The display of claim 2, wherein the liquid crystal display further comprises a condition indicating portion having at least one shutter, the shutter defining a display window, the display window being of a preselected color when the shutter defining the window is in an unactivated state, the shutter being activatable by the measuring device to indicate a condition of the measuring device.

4. The display of claim 2, wherein:
(a) the front polarizer of the liquid crystal display comprises a dichroic polarizer that permits only the preselected color for each window to be reflected out of the liquid crystal display; and
(b) the front polarizer has a polarizing axis parallel to a polarizing axis of the rear polarizer.

5. The display of claim 4, wherein the liquid crystal display further comprises a measuring device condition indicating portion having at least one shutter, the shutter defining a display window, the display window being of a preselected color when the shutter defining the window is in an unactivated state, the shutter being activatable by the measuring device to indicate a condition of the measuring device, a portion of the dichroic polarizer corresponding to the measuring device condition indicating portion having a polarizing axis at 90° to a polarizing axis of a portion of the rear polarizer corresponding to the measuring device condition indicating portion.

6. The display of claim 5, wherein the measuring device condition indicating portion comprises:

(a) a first shutter defining a measuring device battery condition indicating display window, the display window having a battery symbol thereon, the battery symbol being of a color that blends with the preselected color of the display window; and
(b) a second shutter defining a measuring device on condition indicating display window, the display window having an on symbol thereon, the on symbol being of a color that blends with the preselected color of the display window.

7. The display of claim 2, wherein:
(a) the reflector comprises a colored reflector behind each shutter, each colored reflector comprising the color or colors preselected for the display window defined by the shutter; and
(b) the front polarizer has a polarizing axis at 90° to a polarizing axis of the rear polarizer whereby each display window is darkened when the corresponding shutter is in an unactivated state and each shutter twists the polarizing axis 90° when the particular shutter is in an activated state to permit the colored light reflected off of the colored reflector to pass out of the liquid crystal display.

8. The display of claim 7, wherein the liquid crystal display further comprises a condition indicating portion having at least one shutter, the shutter defining a display window, the display window being of a preselected color when the shutter defining the window is in an unactivated state, the shutter being activatable by the measuring device to indicate a condition of the measuring device, a portion of the front polarizer corresponding to the condition indicating portion having a polarizing axis parallel to a polarizing axis of a portion of the rear polarizer corresponding to the condition indicating portion.

9. The display of claim 8, wherein the measuring device condition indicating portion comprises:
(a) a first shutter defining a measuring device battery condition indicating display window, the display window having a battery symbol thereon, the battery symbol being of a color that blends with the preselected color of the display window; and
(b) a second shutter defining a measuring device on condition indicating display window, the display window having an on symbol thereon, the on symbol being of a color that blends with the preselected color of the display window.

10. The display of claim 1, 2, 3, 4, 5, 6, 7, 8 or 9 wherein the liquid crystal display comprises an elongated member having the plurality of shutters arranged side by side over its length.

11. The display of claim 10, wherein the intensity level indicating colored display windows comprise in sequence along the length of the display:
(a) a green window indicating a safe condition;
(b) a half green - half yellow window indicating a transition from a safe to a cautious condition;
(c) a yellow window indicating a cautious condition;
(d) a half yellow - half red window indicating a transition from a cautious to a dangerous condition;
(e) a first red window indicating a dangerous condition; and
(f) a second red window indicating a generally accepted upper critical limit of intensity.

12. The display of claim 10, wherein the intensity level indicating display windows are split into discrete first and second halves along the length of the display, the first half indicating a first type of physical condition intensity and the second half indicating a second type of physical condition intensity.

13. The display of claim 12, wherein:
(a) the first type of physical condition intensity is vibration velocity; and
(b) the second type of physical condition intensity is temperature.

14. A vibration meter display for indicating the operating vibration velocity of a machine, comprising a multicolored liquid crystal display, the liquid crystal display comprising a plurality of shutters, each shutter defining a display window, at least some of the display windows, when activated being of a different preselected color or colors from some other activated windows, each shutter being activatable by electronic circuitry responsive to a unique minimum voltage level, the unique minimum voltage level being generated by a vibration meter circuit that converts a corresponding vibration velocity to a voltage level, the preselected color or colors of each window remaining unchanged at a voltage level above its minimum unique voltage level whereby the display indicates a vibration velocity according to the colored display window corresponding to the activated shutter.

15. A vibration meter display for indicating the operating vibration velocity of a machine, comprising a shutter type twist nematic liquid crystal display, the liquid crystal display comprising in sequence from a front side to a rear side a front polarizer, a front glass layer, a twist nematic liquid crystal having a plurality of shutters, each shutter defining a display window, a rear glass layer, a rear polarizer, and a reflector, at least some of the display windows, when activated being of a different preselected color or colors from some other activated windows, each shutter being activatable by electronic circuitry responsive to a unique minimum voltage level, the unique mimimum voltage level being generated by a vibration meter circuit that converts a corresponding vibration velocity of a voltage level, the preselected color or colors of each window remaining unchanged at a voltage level above its minimum unique voltage level whereby the display indicates a vibration velocity according to the colored display window corresponding to the activated shutter.

16. The display of claim 15, wherein the liquid crystal display further comprises a vibration meter condition indicating portion having at least one shutter, the shutter defining a display window, the display window being of a preselected color when the shutter defining the window is in an unactivated-state, the shutter being activatable by the vibration meter to indicate a condition of the vibration meter.

17. The display of claim 15, wherein:
(a) the front polarizer of the liquid crystal display comprises a dichroic polarizer that permits only the selected color for each window to be reflected out of the liquid crystal display; and
(b) the front polarizer has a polarizing axis parallel to a polarizing axis of the rear polarizer.

18. The display of claim 17, wherein the liquid crystal display further comprises a vibration meter condition indicating portion having at least one shutter, the shutter defining a display window, the display window being of a preselected color when the shutter defining the window is in an unactivated state, the shutter being activatable by the vibration meter to indicate a condition of the vibration meter, a portion of the dichroic polarizer corresponding to the vibration meter condition indicating portion having a polarizing axis at 90° to a polarizing axis of a portion of the rear polarizer corresponding to the vibration meter condition indicating portion.

19. The display of claim 18, wherein the vibration meter condition indicating portion comprises:
(a) a first shutter defining a vibration meter battery condition indicating display window, the display window having a battery symbol thereon, the battery symbol being of a color that blends with the preselected color of the display window; and
(b) a second shutter defining a vibration meter on condition indicating display window, the display window having an on symbol thereon, the on symbol being of a color that blends with the preselected color of the display window.

20. The display of claim 15, wherein:
(a) the reflector comprises a colored reflector behind each shutter, each colored reflector comprising the color or colors preselected for the display window defined by the shutter; and
(b) the front polarizer has a polarizing axis at 90° to a polarizing axis of the rear polarizer whereby each display window is darkened when the corresponding shutter is in an unactivated state and each shutter twists the polarizing axis 90° when the particular shutter is in an activated state to permit the colored light reflected off of the colored reflector to pass out of the liquid crystal display.

21. The display of claim 20, wherein the liquid crystal display further comprises a vibration meter condition indicating portion having at least one shutter, the shutter defining a display window, the display window being of a preselected color when the shutter defining the window is in an unactivated state, the shutter being activatable by the vibration meter to indicate a condition of the vibration meter, a portion of the front polarizer corresponding to the vibration meter condition indicating portion having a polarizing axis parallel to a polarizing axis of a portion of the rear polarizer corresponding to the vibration meter condition indicating portion.

22. The display of claim 21, wherein the vibration meter device condition indicating portion comprises:
(a) a first shutter defining a vibration meter battery condition indicating display window, the display window having a battery symbol thereon, the battery symbol being of a color that blends with the preselected color of the display window; and
(b) a second shutter defining a vibration meter on condition indicating display window, the display window having an on symbol thereon, the on symbol being of a color that blends with the preselected color of the display window.

23. The display format of claim 14, 15, 16, 17, 18, 19, 20, 21 or 22, wherein the liquid crystal display comprises an elongated member having the plurality of shutters arranged side by side over its length.

24. The display format of claim 23, wherein the vibration velocity indicating colored display windows comprise in sequence along the length of the display:
(a) a green window indicating a safe operating vibration velocity condition;
(b) a half green - half yellow window indicating a transition from a safe to a cautious operating vibration velocity condition;
(c) a yellow window indicating a cautious operating vibration velocity condition;

(d) a half yellow - half red window indicating a transition from a cautious to a dangerous operating vibration velocity condition;

(e) a first red window indicating a dangerous operating vibration velocity condition; and (f) a second red window indicating a generally accepted upper critical limit of vibration velocity.

25. A vibration meter of the general type in which a vibration meter circuit converts a vibration input level into a corresponding voltage level and having a display comprising a plurality of shutters, each shutter defining a display window, at least some of the display windows, when activated being of a preselected color or colors from some other activated windows, each shutter being activatable by electronic circuitry responsive to a unique minimum voltage level generated by the vibration meter circuit, the preselected color or colors of each window remaining unchanged at a voltage level above its minimum unique voltage level whereby the display indicates a vibration level according to the colored display window corresponding to the activated shutter.

26. The vibration meter of claim 25, wherein the liquid crystal display further comprises a vibration meter condition indicating portion having at least one shutter, the shutter defining a display window, the display window being of a preselected color when the shutter defining the window is in an unactivated state, the shutter being activatable by the vibration meter to indicate a condition of the vibration meter.

27. The vibration meter of claim 25 or 26, wherein the liquid crystal display comprises an elongated member having the plurality of shutters arranged side by side over its length, and wherein the vibration input level indicating colored display windows comprise in sequence along the length of the display:

(a) a green window indicating a safe operating vibration level;

(b) a half green - half yellow window indicating a transition from a safe to a cautious operating vibration level;

(c) a yellow window indicating a cautious operating vibration level;

(d) a half yellow - half red window indicating a transition from a cautious to a dangerous operating vibration level;

(e) a first red window indicating a dangerous operating vibration level; and (f) a second red window indicating a generally accepted upper critical limit of vibration.

* * * * *